United States Patent
Chethik

Patent Number: 5,867,071
Date of Patent: Feb. 2, 1999

[54] HIGH POWER TRANSMITTER EMPLOYING A HIGH POWER QAM MODULATOR

[75] Inventor: Frank Chethik, Palo Alto, Calif.

[73] Assignee: Lockheed Martin Aerospace Corp., Bethesda, Md.

[21] Appl. No.: 911,677

[22] Filed: Aug. 15, 1997

[51] Int. Cl.$^6$ ............................. H03C 3/00; H04L 27/36
[52] U.S. Cl. ........................ 332/103; 375/264; 375/308
[58] Field of Search .................................. 332/103–105; 375/261–265, 279–284, 308; 455/103–105, 129; 331/56, 75

[56] References Cited

U.S. PATENT DOCUMENTS 5,237,292  8/1993  Chethik .................................. 332/103
5,463,355  10/1995 Halloran .................................. 332/103

Primary Examiner—David Mis
Attorney, Agent, or Firm—Kenneth W. Float

[57] ABSTRACT

A high power RF transmitter that uses high power modulators that perform quadrature amplitude modulation (QAM) on a carrier signal after power amplification that is performed in the RF carrier source. The present invention transposes the locations of the modulators and power amplifier, and thus directly modulates a high power carrier signal. An RF carrier source generates a high power RF carrier signal that is split by a power splitter. A lookup table containing $2^B$ words by K bits receives transmit data and mapping data and generates K-tuple modulating data. A plurality of phase key modulators are respectively coupled to outputs of the power splitter and to the lookup table and phase key modulate each of the signal components of the carrier signal using the K-tuple modulating data. A power combiner is coupled to outputs of the phase key modulators for outputting a high power QAM constellation from the transmitter.

8 Claims, 3 Drawing Sheets

HIGH POWER TRANSMITTER EMPLOYING A HIGH POWER QAM MODULATOR

BACKGROUND

The present invention relates generally to RF transmitters, and more particularly, to improved high power RF transmitters employing high power QAM modulators.

For very high data rate and bandwidth efficient transmission, quadrature amplitude modulation (QAM) has become a major waveform option. Many modulator systems have been developed to perform quadrature amplitude modulation and compensate for bandpass distortion and nonlinear effects so that very high symbol rates (in excess of 1 Gsps) may be achieved. Conventional data modulation is performed at low power levels and sometimes at an intermediate frequency, and then frequency shifted and amplified to a suitable power level.

More recently, the assignee of the present invention has developed a modulating array transmitter which is disclosed in U.S. Pat. No. 5,612,651. This patent application teaches a method of combining the outputs of saturated power amplifier stages where each amplifier stage is driven by a QPSK modulator. The amplifier output signals are combined to form QAM high power signals. The invention disclosed in this patent application teaches that locating the modulation closer to the transmitting antenna reduces the number of distorting and performance-limiting elements of the transmitter.

Several patents were uncovered as a result of a computer search performed during the development of the present invention. U.S. Pat. No. 4,453,257 entitled "Spectrum Shaping Microwave Digital Modulators" spectral shaping of data NRZ (non-return to zero) waveforms with combined linear phase modulation methods as a substitute for phase keying modulation. This patent is not relevant to the present invention.

U.S. Pat. No. 4,835,493 entitled "Very Wideband Linear Amplitude Modulation of RF Signal by Vector Summation" discloses the use of linear phase modulators followed by high power amplifiers, but does not discuss the basic vector combining application to high rate QAM digital modulation. The focus of this patent relates to amplitude modulation wherein linear phase modulated signal components are used to achieve only linear amplitude modulation.

U.S. Pat. No. 5,329,259 entitled "Efficient Amplitude/Phase Modulation Amplifier" discloses a means of creating QAM signals by using two constant amplitude vectors. This patent discusses the use of QAM waveforms. However, this patent is not specifically relevant to the present invention.

Accordingly, it is an objective of the present invention to provide for improved high power RF transmitters employing high power QAM modulators.

SUMMARY OF THE INVENTION

To meet the above and other objectives, the present invention provides for a high power RF transmitter that uses a high power modulator that performs quadrature amplitude modulation (QAM) on a carrier signal after power amplification. While conventional data modulation is performed at low power levels and sometimes at an intermediate frequency, the present transmitter directly modulates a high power carrier signal.

The present invention comprises an RF carrier source that generates a high power RF carrier signal that is split by a power splitter. A lookup table containing $2^n$ words of K bits receives transmit data and mapping data and generates K-tuple modulating data. A plurality of phase key modulators are respectively coupled to outputs of the power splitter and to the lookup table and phase key modulate each of the signal components of the carrier signal using the K-tuple modulating data. A power combiner is coupled to outputs of the phase key modulators for outputting a high power QAM constellation from the transmitter.

Binary phase shift keying (BPSK) modulators or quadrature phase shift keying (QPSK) modulators may be employed. The transmitter includes a plurality of power splitters, a plurality of power combiners, and a plurality of modulators along with input and output hybrids.

The present invention transposes the traditional locations of the modulator and power amplifier that performed in the RF carrier source. As a consequence, the present invention enables several economies of implementation and enhancements in performance, and enables the generation of very complex QAM signal constellations having very high precision.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which.

DETAILED DESCRIPTION

Figure 1:
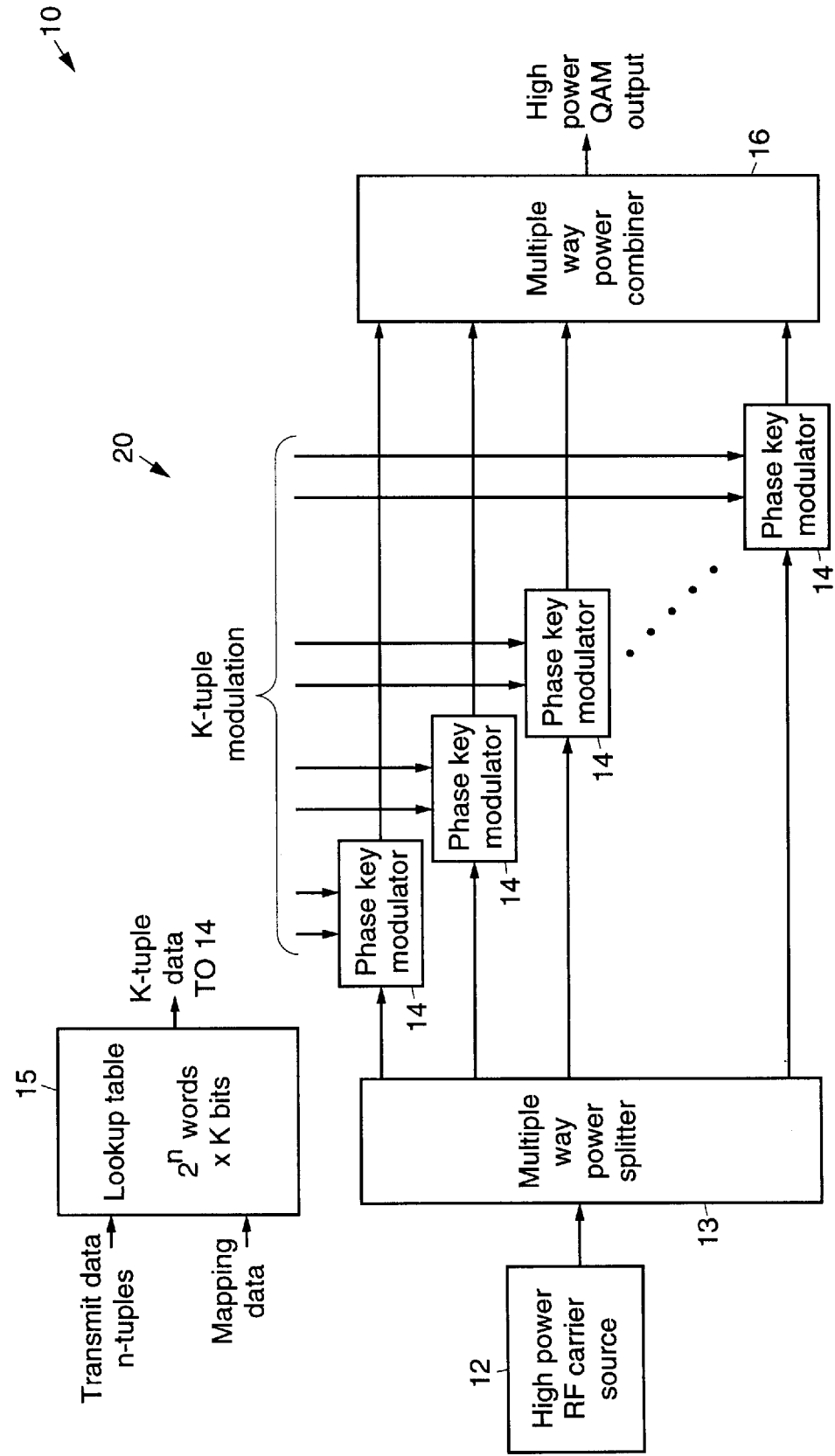
FIG. 1 is a block diagram illustrating a basic high power transmitter employing a high power QAM modulator in accordance with the principles of the present invention.

Referring to the drawing figures, FIG. 1 is a block diagram illustrating a basic high power transmitter 10 employing a high power QAM modulator 20 in accordance with the principles of the present invention. The high power transmitter 10 is comprised of a high power RF carrier source 12 that is coupled to a multiple output power splitter 13. The outputs of the power splitter are respectively coupled to a plurality of phase key modulators 14 that make up the high power QAM modulator 20. The phase key modulators 14 comprise low loss, high power modulators 14. A lookup table 15 containing $2^B$ words by K bits is provided. Transmit data (having n-tuples) that are to be transmitted are supplied to the lookup table 15 along with mapping data that maps the transmit data to the stored words in the lookup table 15, and which generates K-tuple modulating data that are supplied to the phase key modulators 14. Outputs of the phase key modulators 14 are coupled to a multiple input power combiner 16 which outputs a high power QAM constellation from the transmitter 10.

In operation, a high power carrier signal is split into a predetermined number of equal power signal paths. Each signal component is individually phase key modulated using the low loss, high power phase key modulator 14 in each path, using either binary phase shift keying (BPSK) or quadrature phase shift keying (QPSK) modulation, for example. The respective outputs of the phase key modulators 14 are then combined in the power combiner 16 to produce a transmitter signal output.

Figure 2:
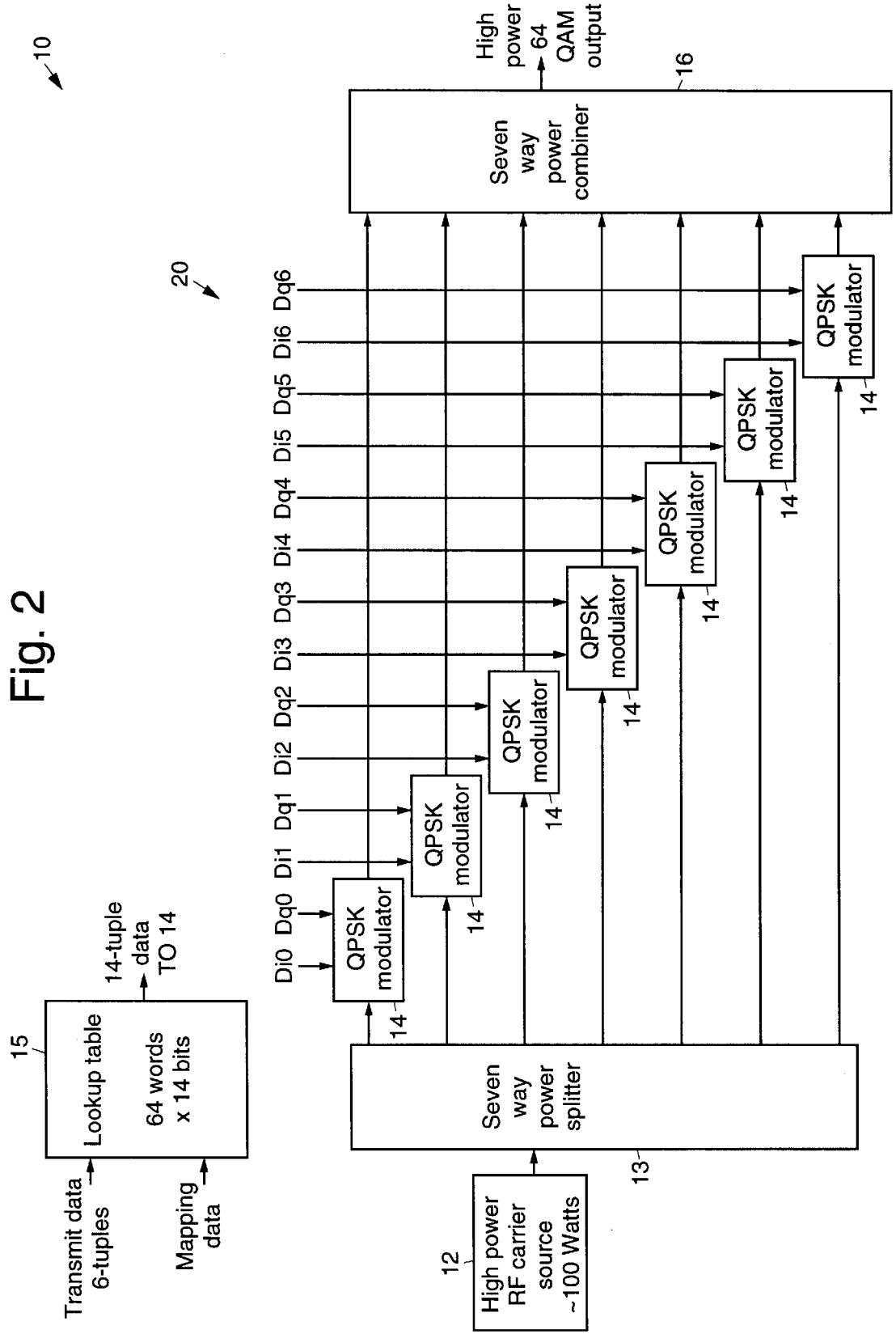
FIG. 2 is a block diagram illustrating a high power transmitter employing a seven stage high power QAM modulator in accordance with the principles of the present invention using QPSK modulators.
Figure 3:
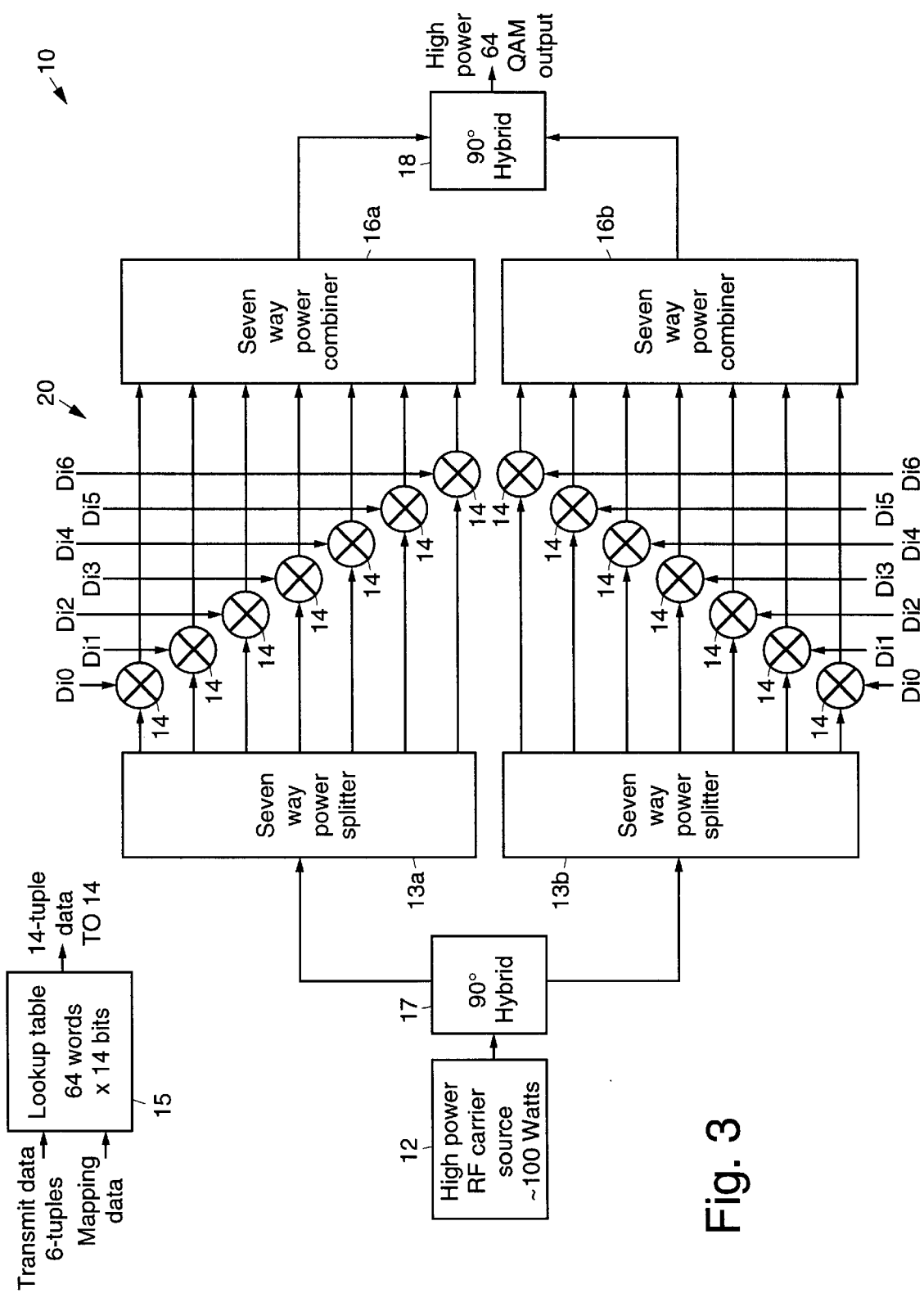
FIG. 3 is a block diagram illustrating a high power fourteen stage high power QAM transmitter in accordance with the principles of the present invention using bi-phase (BPSK) modulators.

Two preferred embodiments for implementing 64 QAM transmitters 10 are shown in FIGS. 2 and 3. More specifically, FIG. 2 is a block diagram illustrating a high power transmitter employing a seven stage high power QAM modulator that uses QPSK modulators. FIG. 3 is a block diagram illustrating a high power fourteen stage high power QAM transmitter that uses bi-phase modulators. A 64 QAM transmitter 10 requires 7 QPSK modulators 14, while a 256 QAM transmitter 10 requires 15 QPSK modulators 14.

Referring to FIG. 2, 6-tuple transmit data is supplied to the lookup table 15 which contains 64 words by 14 bits. The output of the lookup table 15 is 14-tuple modulating data (Di0 . . . Di6, Dq0 . . . Dq6) that are supplied to the modulators 14. The high power RF source 12 has an output power on the order of 100 Watts, and produces a high power carrier signal that is input to a seven way power splitter 13. Outputs of the seven way power splitter 13 are coupled to seven QPSK modulators 14 along with the modulating data from the lookup table 15. The high power carrier signal supplied by the high power RF source 12 is QPSK modulated in each of the modulators 14 using the modulating data from the lookup table 15. A seven way power combiner 16 combines the outputs of each of the modulators 14 to produce a 64 QAM constellation that is output from the transmitter 10.

Referring to FIG. 3, high power carrier signal generated by the high power (100 Watt) RF source 12 is coupled to a 90° hybrid 17 which splits the carrier signal along two paths which are 90° out of phase with respect to each other. Each of the paths carries about 50 Watts of power. The split carrier signal is supplied to two seven way power splitters 13a, 13b which separately distribute the split carrier signal to first inputs of seven bi-phase modulators 14 or mixers 14. 6-tuple transmit data is supplied to the lookup table 15 which contains 64 words by 14 bits. The output of the lookup table 15 is 14-tuple modulating data (Di0 . . . Di6, Dq0 . . . Dq6) that are supplied to respective second inputs of the individual bi-phase modulators 14.

The high power carrier signal supplied by the high power RF source 12 is modulated in each of the bi-phase modulators 14 using the 14-tuple modulating data from the lookup table 15. Two seven way power combiners 16a, 16b combines the outputs of the respective sets of modulators 14a, 14b. The respective combined outputs of the seven way power combiners 16a, 16b are combined using a 0° hybrid 18 to produce a 64 QAM constellation that is output from the transmitter 10.

There are many ways to generate high levels of RF carrier power with high efficiency. Tens to hundreds of Watts of power over a large range of the microwave and millimeter wave spectrum may be generated using Gunn diode oscillators, for example. Orders of magnitude high power may be generated using Klystrons and Magnetrons, or other similar devices. The power is preferentially generated by a narrow band device, thus avoiding the necessity for wideband amplifier systems such as traveling wave tube amplifiers (TWTAs).

The use of QPSK or BPSK modulators 14 in the transmitters 10 depends on a number of design requirements such as the complexity of the QAM constellation that is generated, the power limitations of the switching devices of the phase key modulators 14, and the required number of redundant stages needed to implement a failure-robust system, for example, such as may be designed for space applications. The QAM constellation may be formed in the manner described in the above-cited patent application entitled "Modulating Array Transmitter".

Thus, improved high power RF transmitters employing high power QAM modulators have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A high power transmitter comprising:

a high power RF carrier source for generating a high power RF carrier signal;

a multiple output power splitter coupled to the high power RF carrier source;

a lookup table containing $2^B$ words by K bits for receiving n-tuple transmit data that is to be transmitted and mapping data that maps the transmit data to the stored words in the lookup table, for generating K-tuple modulating data;

a plurality of phase key modulators that are respectively coupled to each of the outputs of the power splitter and to the lookup table for phase key modulating each of the signal components of the carrier signal using the K-tuple modulating data supplied by the lookup table; and a multiple input power combiner coupled to outputs of the phase key modulators for outputting a high power QAM constellation from the transmitter.

2. The transmitter of claim 1 wherein the plurality of phase key modulators each comprise binary phase shift keying modulators.

3. The transmitter of claim 2 wherein the plurality of phase key modulators each comprise quadrature phase shift keying modulators.

4. The transmitter of claim 1 wherein 6-tuple transmit data is supplied to the lookup table which contains 64 words by 14 bits, the lookup table outputs 14-tuple modulating data that are supplied to the modulators, the power splitter comprises a seven way power splitter whose outputs are coupled to seven QPSK modulators, and the power combiner comprises a seven way power combiner that combines the outputs of each of the modulators to produce a 64 QAM constellation that is output from the transmitter.

5. The transmitter of claim 1 further comprising:

a 90° hybrid 1 for splitting the carrier signal along two paths;

and wherein the power splitter comprises two seven way power splitters respectively disposed along the two paths that separately distribute the split carrier signal;

and wherein the split carrier signals are coupled by the two seven way power splitters to first inputs of two sets of seven bi-phase modulators;

and wherein the lookup table contains 64 words by 14 bits, and whose output is 14-tuple modulating data that are supplied to respective second inputs of the bi-phase modulators;

and wherein the power combiner comprises two seven way power combiners that combine the outputs of the respective sets of modulators;

and wherein the transmitter further comprises a 0° hybrid coupled to the seven way power combiners for combining the respective outputs thereof to produce a 64 QAM constellation that is output from the transmitter.

6. A high power transmitter comprising:

a high power RF carrier source for generating a high power RF carrier signal;

a seven way power splitter coupled to the high power RF carrier source;

a lookup table containing 64 words by 14 bits for receiving 6-tuple transmit data that is to be transmitted and mapping data that maps the transmit data to the stored words in the lookup table, for generating 14-tuple modulating data;

a plurality of phase key modulators that are respectively coupled to each of the outputs of the power splitter and to the lookup table for phase key modulating each of the signal components of the carrier signal using the K-tuple modulating data supplied by the lookup table; and a seven way power combiner coupled to outputs of the phase key modulators for outputting a high power 64 QAM constellation from the transmitter.

7. The transmitter of claim 6 wherein the plurality of phase key modulators each comprise quadrature phase shift keying modulators.

8. A high power transmitter comprising:

a high power RF carrier source for generating a high power RF carrier signal;

a 90° hybrid for splitting the carrier signal along two paths;

two seven way power splitters coupled to the 90° hybrid and respectively disposed along the two paths that separately distribute the split carrier signal;

a lookup table containing 64 words by 14 bits for receiving 6-tuple transmit data that is to be transmitted and mapping data that maps the transmit data to the stored words in the lookup table, for generating 14-tuple modulating data;

a plurality of sets of bi-phase modulators respectively coupled to each of the outputs of the power splitters and to the lookup table for phase key modulating each of the signal components of the split carrier signal using the 14-tuple modulating data supplied by the lookup table; and two seven way power combiners coupled to outputs of the respective sets of modulators that combine the outputs of the respective sets of modulators; and a 0° hybrid coupled to the seven way power combiners for combining the respective outputs thereof to produce a 64 QAM constellation that is output from the transmitter.

* * * * *